United States Patent
Tsao et al.

(10) Patent No.: US 7,838,986 B2
(45) Date of Patent: Nov. 23, 2010

(54) ILLUMINATION DEVICE

(75) Inventors: Chih-Chung Tsao, Miao-Li Hsien (TW); Chih-Ming Lai, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 101 days.

(21) Appl. No.: 12/206,171

(22) Filed: Sep. 8, 2008

(65) Prior Publication Data

US 2009/0207606 A1    Aug. 20, 2009

(30) Foreign Application Priority Data

Feb. 15, 2008    (TW) .............................. 97105332 A

(51) Int. Cl.
*H01L 23/34*    (2006.01)
(52) U.S. Cl. .................... 257/712; 257/81; 257/99; 257/98; 362/294; 362/373
(58) Field of Classification Search ............. 362/294, 362/373, 800; 257/81, 712, 97–99
See application file for complete search history.

(56) References Cited

U.S. PATENT DOCUMENTS

| 3,814,633 | A  | * | 6/1974  | Freedman et al. | ........... 136/205 |
| 5,441,576 | A  |   | 8/1995  | Bierschenk et al. | |
| 7,628,507 | B2 | * | 12/2009 | Allen et al. | ................. 362/230 |
| 7,633,154 | B2 | * | 12/2009 | Dai et al. | .................... 257/712 |
| 2004/0120156 | A1 | * | 6/2004 | Ryan | ........................... 362/373 |
| 2006/0151801 | A1 | * | 7/2006 | Doan et al. | ................... 257/99 |

FOREIGN PATENT DOCUMENTS

| CN | 101106169 A | 1/2008 |
| TW | I252900 | 4/2006 |
| TW | 200708848 | 3/2007 |

* cited by examiner

*Primary Examiner*—Anabel M Ton
(74) *Attorney, Agent, or Firm*—Andrew C. Cheng

(57) ABSTRACT

An illumination device includes at least one solid-state light source, a thermoelectric cooler, a heat dissipation device and a first metal film. The thermoelectric cooler has a cold end and a hot end, and the cold end thermally contacts the solid-state light source. The heat dissipation device thermally contacts the hot end of the thermoelectric cooler. The first metal film is formed on the hot end of the thermoelectric cooler and is sandwiched between the heat dissipation device and the hot end of the thermoelectric cooler.

16 Claims, 3 Drawing Sheets

ILLUMINATION DEVICE

CROSS-REFERENCE TO RELATED APPLICATIONS

This application is related to the following commonly-assigned copending applications: Ser. No. 12/233,005, entitled "THERMOELECTRIC COOLER AND ILLUMINATION DEVICE USING SAME". Disclosures of the above-identified application is incorporated herein by reference.

BACKGROUND

1. Field of the Invention

The present invention generally relates to an illumination device, and particularly to an illumination device utilizing a thermoelectric cooler.

2. Description of Related Art

In recent years, due to their excellent light quality and high luminous efficiency, light emitting diodes (LEDs) have begun to substitute for cold cathode fluorescent lamps (CCFLs) as a light source of an illumination device, referring to a paper in the title of "Solid-State Lighting: Toward superior Illumination" by Michael S. Shur, etc. on proceedings of the IEEE, Vol. 93, NO. 10 (October, 2005).

LEDs normally generate a significant amount of heat when functioning, affecting the stability thereof. When the temperature of the LED is too high, light intensity of the LED may be attenuated gradually, shorten the life of the device.

What is needed, therefore, is an illumination device with improved heat dissipation efficiency which can overcome the described limitations.

SUMMARY

An illumination device includes at least one solid-state light source, a thermoelectric cooler, a heat dissipation device and a first metal film. The thermoelectric cooler has a cold end and a hot end, and the cold end thermally contacts the solid-state light source. The heat dissipation device thermally contacts the hot end of the thermoelectric cooler. The first metal film is formed on the hot end of the thermoelectric cooler and sandwiched between the heat dissipation device and the hot end of the thermoelectric cooler.

Other advantages and novel features of the present illumination device will become more apparent from the following detailed description when taken in conjunction with the accompanying drawings.

BRIEF DESCRIPTION OF THE DRAWINGS

Many aspects of the present illumination device can be better understood with reference to the following drawings. The components in the drawings are not necessarily drawn to scale, the emphasis instead being placed upon clearly illustrating the principles of the present illumination device. Moreover, in the drawings, like reference numerals designate corresponding parts throughout the several views.

DETAILED DESCRIPTION OF EMBODIMENTS

Figure 1:
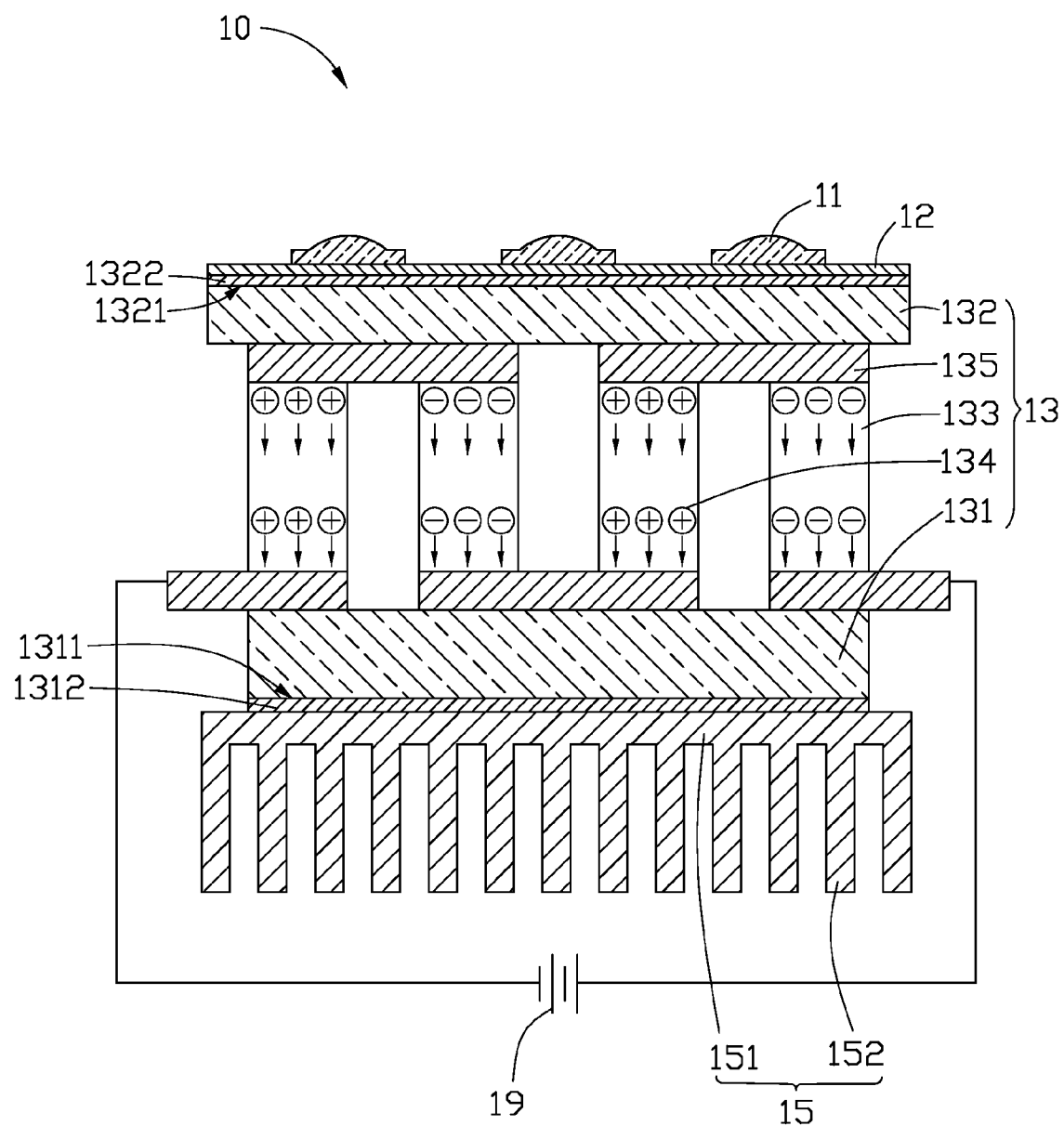
FIG. 1 is a cross-section of an illumination device, in accordance with a first embodiment of the present invention.

Referring to FIG. 1, an illumination device 10, in accordance with a first embodiment, is shown. The illumination device 10 comprises at least one solid-state light source 11, a thermoelectric cooler 13 and a heat dissipation device 15.

Figure 2:
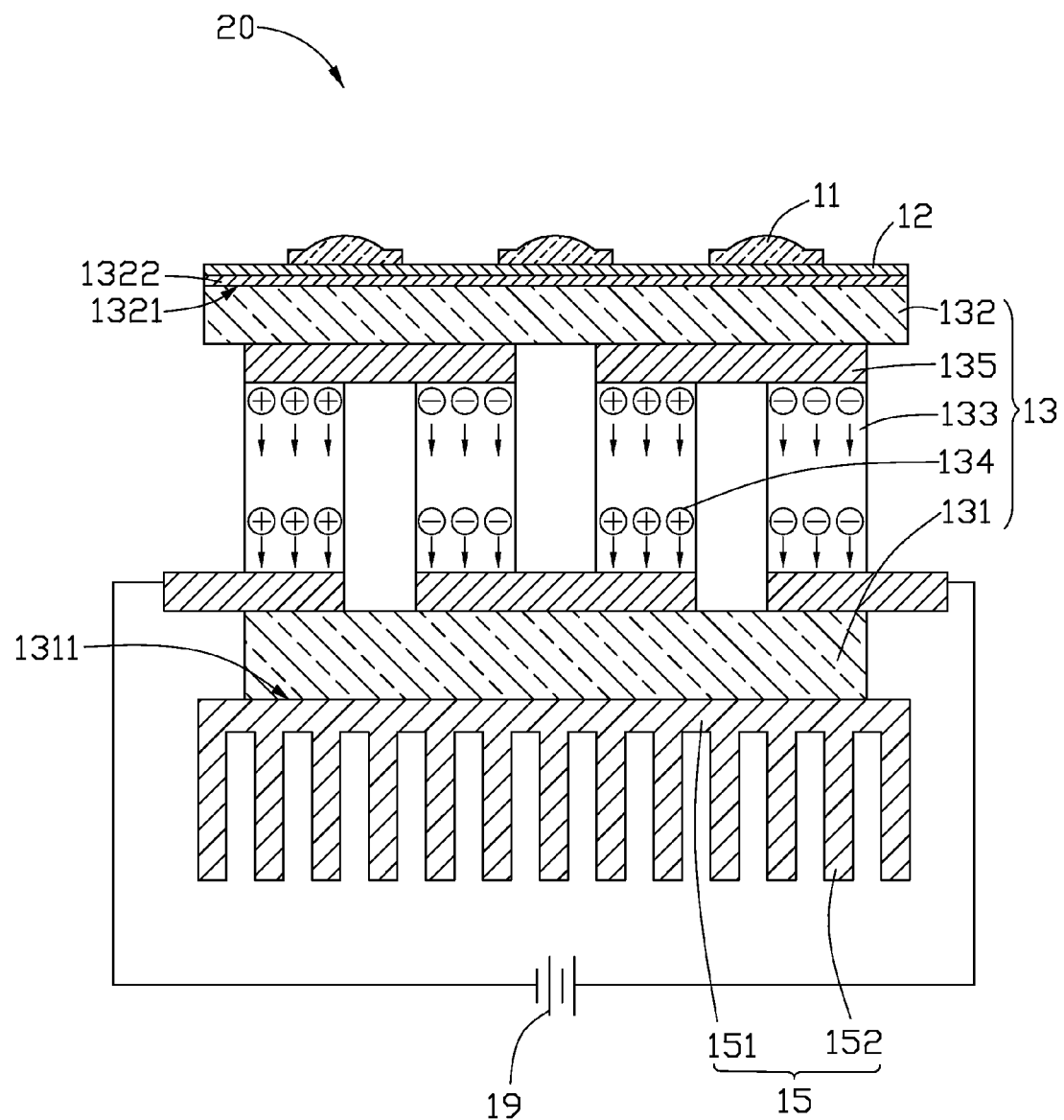
FIG. 2 is a cross-section of an illumination device, in accordance with a second embodiment of the present invention.

Referring to FIGS. 1 and 2, the at least one solid-state light source 11 includes a plurality of LEDs. The LEDs can be white or multicolored, such as red, green and blue.

The thermoelectric cooler 13 is a solid state Peltier effect heat pump and comprises a hot end 131, a cold end 132 opposite to the hot end 131, a plurality of N-type semiconductor elements 133, a plurality of P-type semiconductor elements 134, and a plurality of connection circuits 135 electrically connecting the N-type semiconductor elements 133 and the P-type semiconductor elements 134. The N-type semiconductor elements 133, the P-type semiconductor elements 134 and the connection circuits 135 are sandwiched between the hot end 131. The heat dissipation device 15 thermally contacts the hot end 131 of the thermoelectric cooler 13.

The thermoelectric cooler 13 transfers heat generated from the LEDs 11 to the heat dissipation device 15. The hot end 131 and the cold end 132 of the thermoelectric cooler 13 are insulated material with low heat conductivity, such as ceramic. Thus, a first metal film 1312 with high heat conductivity, such as copper and aluminum is applied on an outer surface 1311 of the hot end 131. The first metal film 1312 is sandwiched between the hot end 131 and the heat dissipation device 15 to enhance heat transfer efficiency.

The heat dissipation device 15 comprises a base 151, and a plurality of fins 152 extending from the base 151 and substantially perpendicular to the base 151. The base 151 is coupled to the first metal film 1312, and thermally contacts the hot end 131 of the thermoelectric cooler 13 through the first metal film 1312. In particular, the first metal film 1312 can be formed on the outer surface 1311 by vacuum deposition or electronic deposition. Preferably, the first metal film 1312 is metal alloy with a low melting point, such as gold-zinc alloy or gold-beryllium alloy, such that base 151 can easily be fixed to the first metal film 1312 by eutectic bonding or soldering.

The LEDs 11 are mounted on a printed circuit board 12, and thermally contact the cold end 132 through the printed circuit board 12. The printed circuit board 12 can be metal, ceramic or fiberglass.

In operation, an exterior power supply 19 having an anode and a cathode supplies power to the thermoelectric cooler 13, wherein the N-type and P-type semiconductor elements 133, 134 are electrically connected to the anode and the cathode, respectively. Heat is generated from the LEDs 11 during illumination. When the thermoelectric cooler 13 is electrically connected to a power supply 19, electrons with negative polarity in the N-type semiconductor elements 133 move to the anode, and holes with positive polarity in the P-type semiconductor elements 134 move to the cathode. Heat generated from the LEDs 11 is thus transferred from the cold end 132 to the hot end 131 of the thermoelectric cooler 13 via electronic energy. Heat accumulated on the hot end 131 of the thermoelectric cooler 13 is immediately dissipated via the fins 152. Thus, by application of the thermoelectric cooler 13, efficiency of heat dissipation of the LEDs 11 is improved, and the illumination device 10 operates at all times in an acceptable temperature range to achieve stable optical performance.

Furthermore, a second metal film 1322 with high heat conductivity can also be applied on the outer surface 1321 of the cold end 132. The second metal film 1322 is similar to the first metal film 1312, and is sandwiched between the cold end 132 and the printed circuit board 12 to enhance heat transfer efficiency of the thermoelectric cooler 13.

FIG. 2 shows an illumination device 20, in accordance with the second embodiment, differing from the illumination device 10 only in the inclusion of only a metal film (second metal film 1322) thermally contacting the printed circuit board 12

Figure 3:
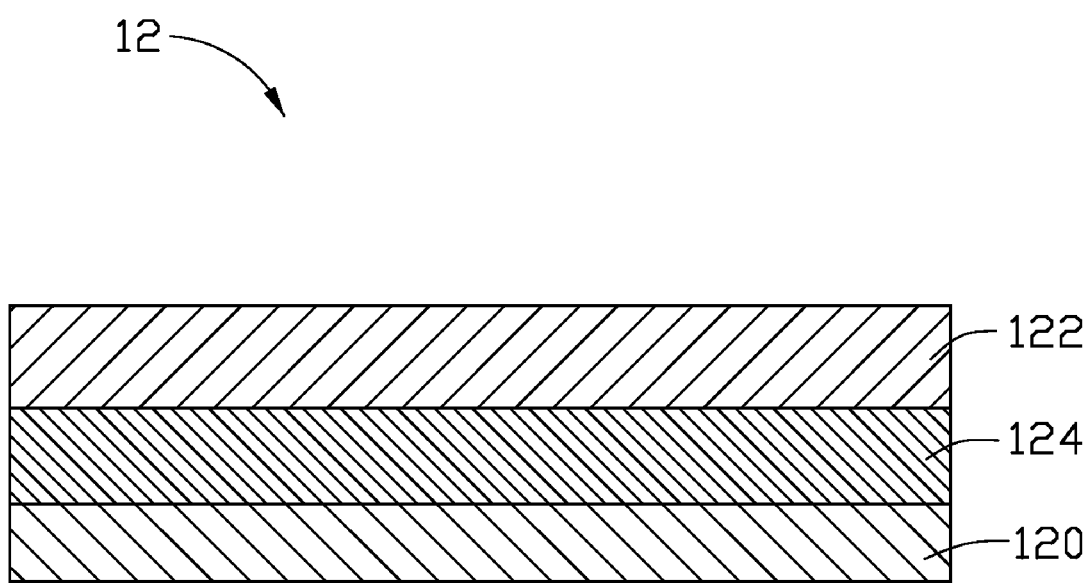
FIG. 3 is a cross-section of a metal core printed circuit board of FIG. 2.

Referring to FIG. 3, the printed circuit board 12 is a metal core printed circuit board (MCPCB). The metal core printed circuit board 12 includes an aluminum base 120, a copper foil layer 122 and an insulated layer 124. The insulated layer 124 is sandwiched between the aluminum base 120 and the copper foil layer 122. A circuit (not shown) is formed on the copper foil layer 122, on which the LEDs 11 is mounted. The second metal film 1322 is sandwiched between the cold end 132 of the thermoelectric cooler 13, and metal alloy of low melting point, such as gold-zinc alloy, or gold-beryllium alloy, coupled to the aluminum base 120 by eutectic bonding or solder bonding.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An illumination device, comprising:
   at least one solid-state light source;
   a thermoelectric cooler having a cold end and a hot end, the cold end thermally contacting the at least one solid-state light source;
   a heat dissipation device, the heat dissipation device thermally contacting the hot end of the thermoelectric cooler; and
   a first metal film, formed on the hot end of the thermoelectric cooler and sandwiched between the heat dissipation device and the hot end of the thermoelectric cooler;
   wherein the heat dissipation device comprises a base thermally contacting the hot end of the thermoelectric cooler and a plurality of fins extending from the base away from the hot end, with the first metal film coupled to the base of the heat dissipation device by eutectic bonding or solder bonding.

2. The illumination device of claim 1, wherein the first metal film is formed on the hot end of the thermoelectric cooler by vacuum deposition or electronic deposition.

3. The illumination device of claim 1, wherein the first metal film is metal alloy containing gold.

4. The illumination device of claim 3, wherein the metal alloy is gold-zinc alloy or gold-beryllium alloy.

5. The illumination device of claim 1, further comprising a printed circuit board securing the at least one solid-state light source thereon, and the at least one solid-state light source thermally contacting the cold end of the thermoelectric cooler via the printed circuit board.

6. The illumination device of claim 5, further comprising a second metal film, formed on the cold end of the thermoelectric cooler and sandwiched between the thermoelectric cooler and the printed circuit board.

7. The illumination device of claim 1, wherein the at least one solid-state light source comprises a plurality of light emitting diodes.

8. An illumination device, comprising:
   a printed circuit board;
   a plurality of LEDs mounted on the printed circuit board;
   a thermoelectric cooler having a cold end and a hot end;
   a heat dissipation device, thermally contacting the hot end of the thermoelectric cooler; and
   a metal film, formed on the cold end of the thermoelectric cooler and sandwiched between the printed circuit board and the cold end, the cold end thermally contacting the LEDs via the metal film.

9. The illumination device of claim 8, wherein the printed circuit board is a metal core printed circuit board.

10. The illumination device of claim 8, wherein the metal core printed circuit board comprises an aluminum base, a copper foil layer, and an insulated layer, with the insulated layer sandwiched between the aluminum base and the copper foil layer, and a circuit formed on the copper foil layer, and wherein the LEDs are mounted on the circuit of the copper foil layer, and the metal film is coupled to the aluminum base of the metal core printed circuit board by eutectic bonding or solder bonding.

11. The illumination device of claim 8, wherein the metal film is formed on the cold end of the thermoelectric cooler by vacuum deposition or electronic deposition.

12. An illumination device, comprising:
    at least one solid-state light source;
    a thermoelectric cooler having a cold end and a hot end, the cold end thermally contacting the at least one solid-state light source;
    a heat dissipation device, the heat dissipation device thermally contacting the hot end of the thermoelectric cooler; and
    a first metal film, formed on the hot end of the thermoelectric cooler and sandwiched between the heat dissipation device and the hot end of the thermoelectric cooler;
    wherein the first metal film is metal alloy containing gold.

13. The illumination device of claim 12, wherein the metal alloy is gold-zinc alloy or gold-beryllium alloy.

14. The illumination device of claim 12, further comprising a printed circuit board securing the at least one solid-state light source thereon, and the at least one solid-state light source thermally contacting the cold end of the thermoelectric cooler via the printed circuit board.

15. The illumination device of claim 14, further comprising a second metal film, formed on the cold end of the thermoelectric cooler and sandwiched between the thermoelectric cooler and the printed circuit board.

16. The illumination device of claim 12, wherein the at least one solid-state light source comprises a plurality of light emitting diodes.

\* \* \* \* \*